US010877106B2

(12) United States Patent
Watanabe et al.

(10) Patent No.: US 10,877,106 B2
(45) Date of Patent: Dec. 29, 2020

(54) CONDUCTION INSPECTION JIG AND INSPECTION METHOD OF CONDUCTION PIN

(71) Applicant: YAZAKI CORPORATION, Tokyo (JP)

(72) Inventors: Shoichi Watanabe, Shizuoka (JP); Keigo Seki, Shizuoka (JP); Hiroshi Takeuchi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 48 days.

(21) Appl. No.: 16/457,327

(22) Filed: Jun. 28, 2019

(65) Prior Publication Data

US 2020/0011920 A1 Jan. 9, 2020

(30) Foreign Application Priority Data

Jul. 6, 2018 (JP) ................................ 2018-128737

(51) Int. Cl.

| | |
|---|---|
| ***G01R 31/04*** | (2006.01) |
| ***G01R 31/69*** | (2020.01) |
| ***H01R 13/64*** | (2006.01) |
| ***H01R 13/631*** | (2006.01) |

(52) U.S. Cl.

CPC ........... *G01R 31/69* (2020.01); *H01R 13/631* (2013.01); *H01R 13/64* (2013.01); *H01R 2201/20* (2013.01)

(58) Field of Classification Search

CPC .. G01R 31/04; G01R 31/045; G01R 31/0416; G01R 31/66; G01R 31/69; H01R 13/64; H01R 13/631; H01R 13/641; H01R 13/4538; H01R 13/193; H01R 13/4223; H01R 13/4361; H01R 2201/20

See application file for complete search history.

(56) References Cited

U.S. PATENT DOCUMENTS

| | | | | |
|---|---|---|---|---|
| 7,927,130 B2 * | 4/2011 | Fukuda | H01R 13/641 | 439/488 |
| 8,816,696 B2 * | 8/2014 | Kogasumi | H01R 43/20 | 324/538 |
| 2003/0162430 A1 * | 8/2003 | Shinzou | G01R 31/69 | 439/310 |
| 2008/0309360 A1 * | 12/2008 | Hall | G01R 31/69 | 324/756.05 |
| 2010/0271043 A1 | 10/2010 | Katoh | | |

FOREIGN PATENT DOCUMENTS

| | | |
|---|---|---|
| JP | 2009-163953 A | 7/2009 |

* cited by examiner

*Primary Examiner* — Thang X Le
(74) *Attorney, Agent, or Firm* — Kenealy Vaidya LLP

(57) ABSTRACT

In a jig main body constructing a conduction inspection jig, a pin guard plate is arranged so as to be movable back and forth between the main body bottom portion and the main body guide portion. Before conduction inspection, the tip end of a conduction pin is positioned outside the conduction pin hole. When the pin guard plate moves towards a side of the main body bottom portion with a start of the conduction inspection, only the tip end of the normal conduction pin without bent enters into the conduction pin hole and penetrates, and thereby protrudes from the conduction pin hole. An inspection method of a conduction pin includes an arranging step of arranging the tip end outside the conduction pin hole, a moving step of moving the pin guard plate, and a detecting step of detecting whether or not the tip end enters into the conduction pin hole.

4 Claims, 5 Drawing Sheets

10 12 13 14 41 40 19 11 31 32 21 20 35 51 50 30 39

CONDUCTION INSPECTION JIG AND INSPECTION METHOD OF CONDUCTION PIN

CROSS-REFERENCE TO RELATED APPLICATIONS

This application is based on and claims priority under 35 USC 119 from Japanese Patent Application No. 2018-128737 filed on Jul. 6, 2018, the contents of which are incorporated herein by reference.

TECHNICAL FIELD

The present invention relates to a conduction inspection jig and an inspection method of a conduction pin. In particular, the present invention relates to a conduction inspection jig for inspecting conduction by bringing a conduction pin into contact with a terminal accommodated in a connector, and an inspection method of a conduction pin disposed in the conduction inspection jig.

BACKGROUND ART

Conventionally, a conduction inspection jig for inspecting conduction of a terminal of a connector installed in a vehicle or the like includes a connector set portion fixed to a jig substrate and an inspection portion capable of advancing and retracting toward the connector set portion. The inspection portion includes a plurality of conduction pins, a conduction pin protection plate (hereinafter referred to as a "pin guard plate") for guiding the conduction pin, and a spring for biasing the pin guard plate in a connector setting portion direction. Then, the connector is set in the connector set portion, the inspection portion is moved and the front end surface of the pin guard plate is pressed against the rear end surface of the connector so as to bring the conduction pin into contact with a terminal.

However, in the case where the front end surface of the pin guard plate is pressed against the rear end surface of the connector, a reliable conduction inspection cannot be performed due to the inclination of the pin guard plate, so that an invention (conduction pin protection structure of the conduction inspection jig) that solves the problem has been disclosed (for example, see Patent Document 1).

Patent Document 1: JP-A-2009-163953 (page 4-6, FIG. 1)

SUMMARY OF INVENTION

In the invention disclosed in Patent Document 1 (hereinafter, sometimes referred to as a "conventional technique"), a set portion end face parallel to a rear end surface of a connector set in a connector set portion is provided, the inspection portion is provided with an inspection portion plate wall parallel to the rear end surface of the set portion, a pin guard plate biased by a spring is arranged on the front end surface side of the inspection portion plate wall, and a conduction pin penetrates the inspection portion plate wall and the pin guard plate. Therefore, during the conduction inspection, the pin guard plate is sandwiched between the set portion end surface and the inspection portion plate wall, and the inclination is prevented, so that reliable conduction inspection can be performed.

However, in the prior art, since the tip end of the conduction pin enters into the conduction pin hole formed in the pin guard plate, it is not possible to detect the presence or absence of the bending of the conduction pin before the conduction inspection. Therefore, there is a problem of an erroneous inspection or damage to a connector when the tip end of the conduction pin protrudes from the conduction pin hole in a bent (falling) state.

An object of the present invention is to solve the above problem and to provide a conduction inspection jig and a conduction pin inspection method capable of reliably conducting conduction inspection without damaging the connector.

The conduction inspection jig according to the present invention includes: a tubular jig main body including a main body bottom portion; a main body guide portion formed on an opening portion of the jig main body and guiding a connector to be inspected; a pin guard plate arranged so as to be movable back and forth between the main body bottom portion and the main body guide portion; and a conduction pin fixed to the main body bottom portion and capable of being in contact with a terminal to be inspected installed in the connector. A conduction pin hole is formed in the pin guard plate, and disposed in a same arrangement as the terminal to be inspected, a tip end of the conduction pin is positioned outside the conduction pin hole before conduction inspection, and when the pin guard plate moves towards a side of the main body bottom portion with a start of the conduction inspection, the conduction pin enters into the conduction pin hole and thereby a tip end of the conduction pin protrudes from the conduction pin hole.

Further, the inspection method of a conduction pin according to the present invention inspects a conduction pin of a conduction inspection jig. The conduction inspection jig includes a tubular jig main body having a main body bottom portion, a main body guide portion formed on an opening portion of the jig main body and guiding a connector to be inspected, a pin guard plate arranged so as to be movable back and forth between the main body bottom portion and the main body guide portion, a conduction pin fixed to the main body bottom portion and capable of being in contact with a terminal to be inspected installed in the connector, and a conduction pin hole disposed in a same arrangement as the terminal to be inspected. The inspection method a first step of arranging a tip end of the conduction pin outside the conduction pin hole; a second step of moving the pin guard plate to a side of the main body bottom portion; and a third step of detecting whether or not the conduction pin enters into the conduction pin hole and the tip end of the conduction pin protrudes from the conduction pin hole or the conduction pin does not enter into the conduction pin hole and the tip end of the conduction pin does not protrude from the conduction pin hole.

The conduction inspection jig according to the present invention is positioned outside the conduction pin hole formed in the pin guard plate before the conduction inspection, only the conduction pin in the unbent and normal posture can enter the conduction pin hole, and the conduction pin in the bent and abnormal posture cannot enter the conduction pin hole, so that the connector is not damaged, and accurate conduction inspection is possible.

Further, in the inspection method of the conduction pin according to the present invention, the third step of detecting whether or not the conduction pin enters the conduction pin hole is included, so that the connector is not damaged, and accurate conduction inspection is possible.

BRIEF DESCRIPTION OF DRAWINGS

FIG. 1A is a perspective view showing the whole thereof, and FIG. 1B is a partial sectional side view showing a connector to be inspected.

FIG. 2A is a front view showing a part (jig main body), and FIG. 2B is a side sectional view showing a part (jig main body).

FIG. 3A is a side sectional view showing a part (jig main body) before the start of the conduction inspection, FIG. 3B is a side sectional view showing a part (jig main body) at the beginning of the conduction inspection.

FIG. 4A is a side sectional view showing a part (jig main body) before the start of the conduction inspection for illustrating effects, and FIG. 4B is a side sectional view of a part (jig main body) at the beginning of the conduction inspection for illustrating effects.

DESCRIPTION OF EMBODIMENTS

Hereinafter, a conduction inspection jig according to a first embodiment of the present invention and a conduction inspection method according to a second embodiment of the present invention will be described with reference to the drawings. Since the drawings are schematically illustrated, the shape and size of each member, or the positional relationship between the members is not limited to the illustrated embodiment.

First Embodiment

Figure 1A:
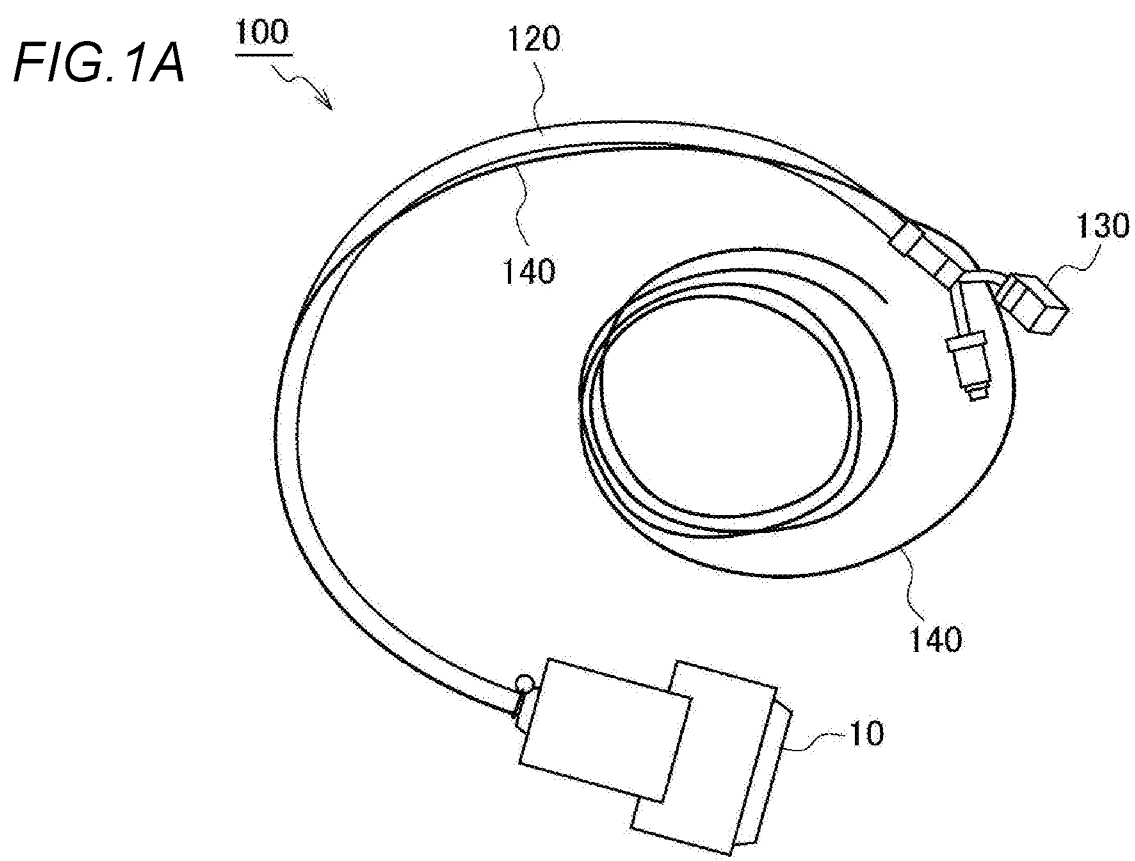
FIGS. 1A and 1B schematically illustrate a conduction inspection jig according to a first embodiment of the present invention.
Figure 1B:
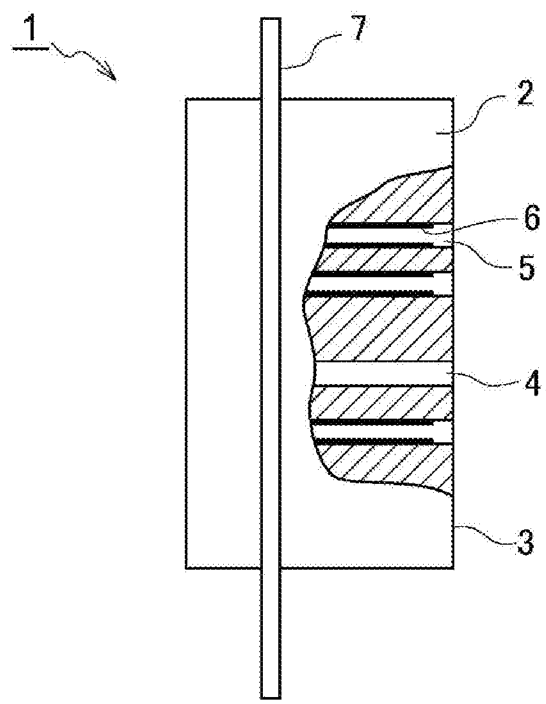
Figure 2A:
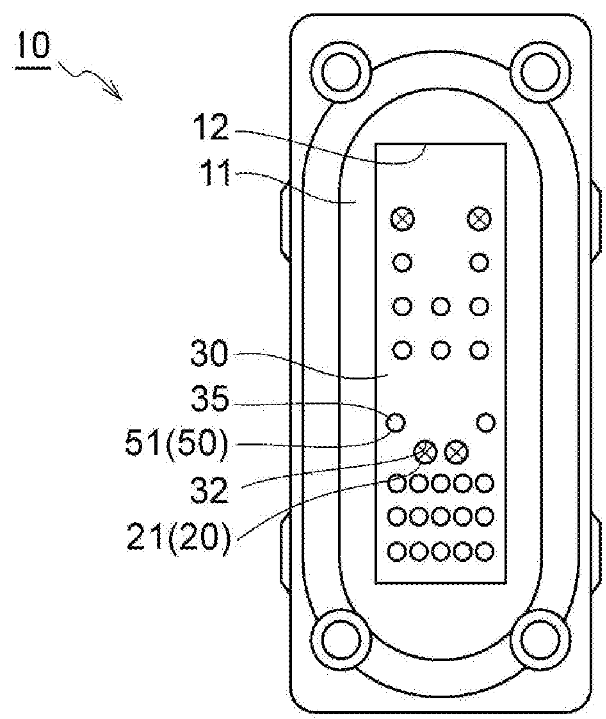
FIGS. 2A and 2B schematically illustrate the conduction inspection jig according to the first embodiment of the present invention.
Figure 2B:
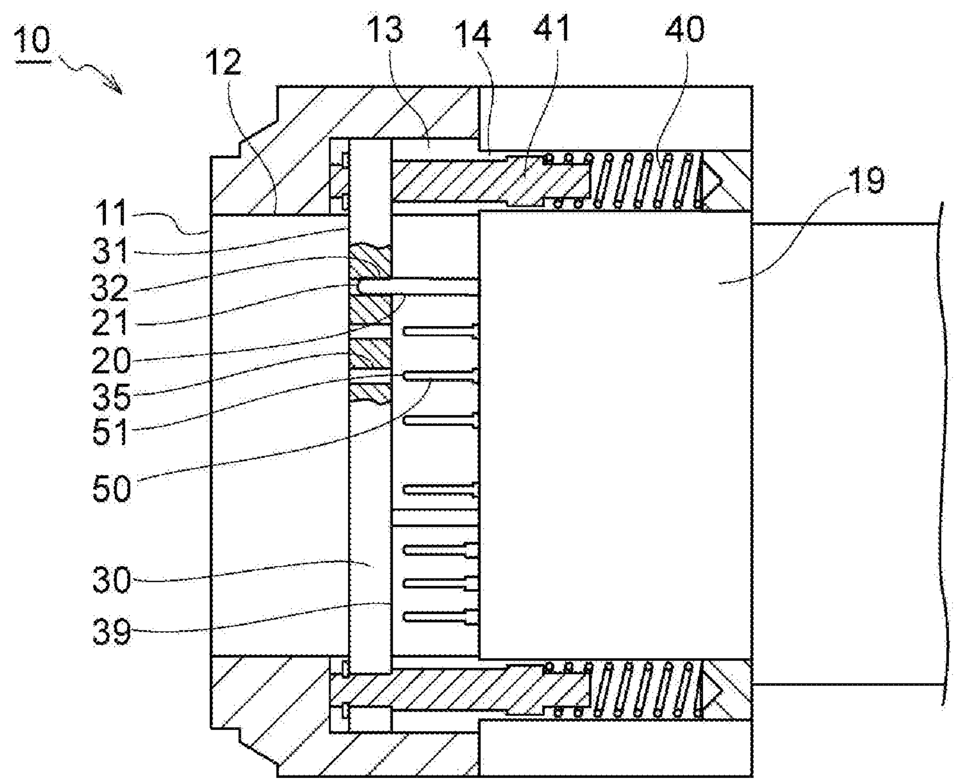

FIGS. 1A to 2B schematically illustrate a conduction inspection jig according to a first embodiment of the present invention, FIG. 1A is a perspective view showing the whole thereof, FIG. 1B is a partial sectional side view showing a connector to be inspected, FIG. 2A is a front view showing a part (jig main body), and FIG. 2B is a side sectional view showing a part (jig main body).

(Whole Configuration)

In FIG. 1A, a conduction inspection jig 100 includes a jig main body 10, a cable 120 coupled to the jig main body 10, a connection connector 130 coupled to the cable 120, and a suspension wire 140 for suspending the jig main body 10.

The connection connector 130 is connected to a conduction inspection device (not shown) that inspects the conduction of a connector (not shown) to be inspected. The suspension wire 140 is bound to the cable 120 at a position close to the jig main body 10 and a position close to the connection connector 130, and is suspended immediately above or near the production line or the like, via a turning means (such as a hoist), a weight loss means (such as a balancer), or an expansion/contraction means (such as spring).

(Connector)

In FIG. 1B, in the connector 1 to be inspected, a recess groove is formed in an end surface (hereinafter referred to as a "connector rear end surface 3") of a substantially rectangular connector rear portion 2, and a portion thereof constitutes a guide pin insertion portion 4. A plurality of terminal holes 5 are formed in the connector rear portion 2, and terminals 6 are accommodated in the terminal holes 5. At this time, the terminals 6 do not protrude from the connector rear end surface 3. Further, a connector flange 7 is provided on the outer periphery of the connector rear portion 2. Also, the terminals 6 include those that are targets of the conduction inspection and those that are not the targets of the conduction inspection.

(Jig Main Body)

In FIGS. 2A and 2B, the jig main body 10 includes a main body bottom portion 19 and a many body opening portion 11, and is formed in a tubular shape. In the main body opening portion 11, a main body guide portion 12 in which the connector 1 of an inspection target is inserted is formed. The main body guide portion 12 has a trumpet-like shape in which a range close to the main body opening portion 11 is slightly enlarged, thereby facilitating insertion of the connector 1. The main body bottom portion 19 may be formed integrally with the jig main body 10, or may be installed on the jig main body 10 after being formed separately.

Further, the jig main body 10 includes guide pins 20 whose rear end (not shown) are fixed to the main body bottom portion 19. Also, the tip ends 21 of the guide pins 20 can enter the guide pin insertion portion 4 formed in the connector rear end surface 3, and four guide pins 20, similar to the guide pin insertion portion 4, are arranged in a substantially rectangular shape that is asymmetric in the front view.

Furthermore, in the jig main body 10, a main body moving portion 13 is formed between the main body guide portion 12 and the main body bottom portion 19. In the body moving portion 13, a pin guard plate 30 is arranged. The pin guard plate 30 is guided to the guide pin 20, and is capable of advancing and retreating. In addition, a spring 40 for biasing the pin guard plate 30 toward the main body guide portion 12 is arranged in a main body spring hole 14. At this time, the guide pins 20 penetrate the guide pin holes 32 formed in the pin guard plate 30. Since the guide pins 20 are substantially rectangular, the pin guard plate 30 is guided in a posture that is not easily inclined with respect to any direction. The spring 40 biases the pin guard plate 30 via a push rod 41. It should be noted that the present invention is not limited to the biasing means, and is not limited to the coiled spring 40. Therefore, even when the spring 40 is removed, for example, the spring 40 may be replaced with an air cylinder, a toggle mechanism, or the like. Further, the guide pins 20 are not essential and may be removed.

Further, the pin guard plate 30 is provided with conduction pin holes 35 having the same arrangement as that of the terminals 6 (terminal holes 5) to be inspected of the terminals 6. The tip ends 51 of the conduction pins 50 or the side surfaces of the conduction pins 50 can contact the terminals 6, and the rear ends or the middle of the conduction pins 50 are fixed to the main body bottom portion 19. The conduction pins 50 are connected to the cable 120. Before the conduction inspection (before the connector 1 is inserted into the main body guide portion 12), the tip ends 51 of the conduction pins 50 are positioned outside the conduction pin holes 35 (extracted from the conduction pin holes 35 in the direction of the main body bottom portion 19).

Therefore, the tip ends 51 of the conduction pins 50 in a normal posture with no bending can enter the conduction pin holes 35, and the tip ends 51 of the conduction pins 50 in an abnormal posture with bent backward cannot enter the conduction pin hole 35.

The inner diameter of the conduction pin hole 35 is a value that allows the conduction pin 50 to bend (the same as falling), and is set to a range that does not have problems with the quality of the connector 1 and the accuracy of the conduction inspection.

(Operation)

Figure 3A:
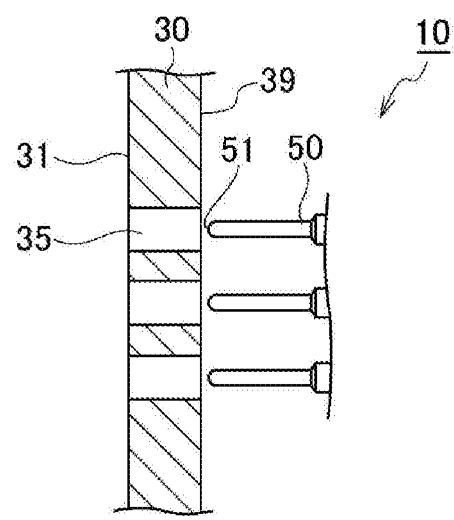
FIGS. 3A to 3B schematically illustrate the operation of the conduction inspection jig according to the first embodiment of the present invention.
Figure 3B:
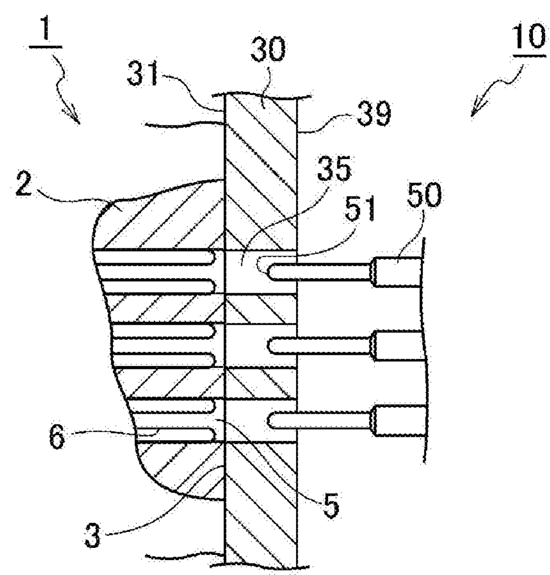
Figure 3C:
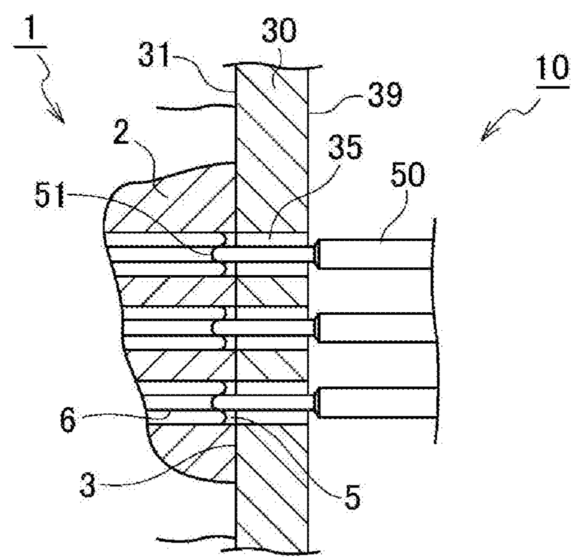
FIG. 3C is a side sectional view of a part (jig main body) in the middle of the conduction inspection.
Figure 4A:
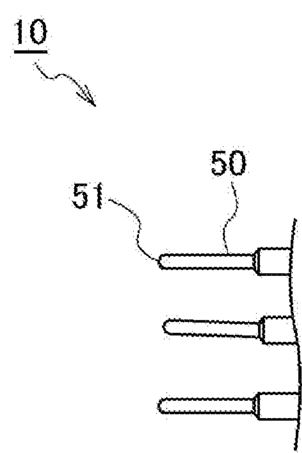
FIGS. 4A and 4B schematically illustrate the operation of the conduction inspection jig according to the first embodiment of the present invention.
Figure 4B:
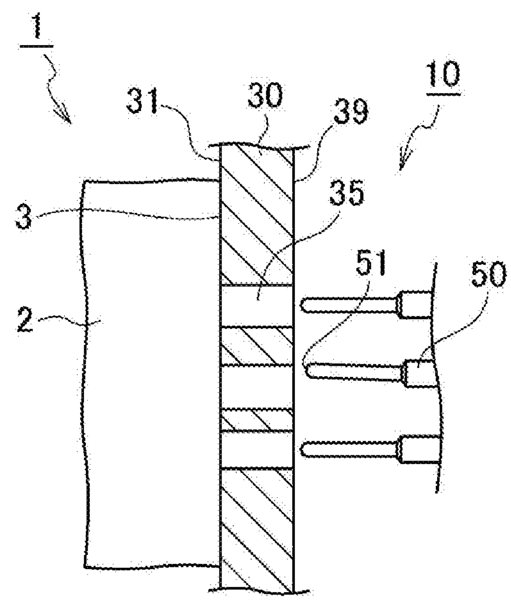

FIGS. 3A to 4B schematically illustrate the operation of the conduction inspection jig according to the first embodiment of the present invention, FIG. 3A is a side sectional view showing a part (jig main body) before the start of the conduction inspection, FIG. 3B is a side sectional view showing a part (jig main body) at the beginning of the conduction inspection, FIG. 3C is a side sectional view of a part (jig main body) in the middle of the conduction inspection, FIG. 4A is a side sectional view showing a part (jig main body) before the start of the conduction inspection for illustrating effects, and FIG. 4B is a side sectional view of a part (jig main body) at the beginning of the conduction inspection for illustrating effects.

In FIG. 3A, before the conduction inspection, as described above, the tip ends 51 of the conduction pins 50 are positioned outside the conduction pin holes 35 formed in the pin guard plate 30. That is, the tip ends 51 are positioned closer to the main body bottom portion 19 than the rear surface 39 of the pin guard plate 30.

In FIG. 3B, when the conduction inspection is started, the connector 1 is inserted into the main body guide portion 12, the connector rear end surface 3 of the connector 1 abuts against the front surface 31 of the pin guard plate 30, and the pin guard plate 30 is pushed and moved toward the main body bottom portion 19, the tip ends 51 of the conduction pins 50 in a normal posture without bent enter the conduction pin holes 35.

In FIG. 3C, when the connector rear end surface 3 of the connector 1 further pushes the front surface 31 of the pin guard plate toward the main body bottom portion 19, the conduction pins 50 penetrate the conduction pin holes 35, and the tip ends 51 protrude from the front surface 31. At this time, the tip ends 51 enter the terminal holes 5 of the connector 1, and the tip ends 51 or the side surfaces of the conduction pins 50 is in contact with the terminals 6.

(Effects)

In FIG. 4A, a case of an abnormal posture in which the tip end 51 of the conduction pin 50 is bent and fallen before the conduction inspection is illustrated.

In FIG. 4B, the conduction inspection is started, and the connector rear end surface 3 of the connector 1 abuts against the front surface 31 of the pin guard plate 30, and pushes the pin guard plate 30 toward the main body bottom portion 19. Then, the tip end 51 of the conduction pin 50 abuts against the rear surface 39 of the pin guard plate 30 so as not to enter the conduction pin hole 35.

That is, the conduction pin 50 in a bent and abnormal posture is blocked by the rear surface 39 of the pin guard plate 30 and cannot enter the conduction pin hole 35, so that the conduction inspection cannot be performed. Therefore, since the conduction inspection is performed only by the conduction pin 50 in the normal posture, it is possible to prevent the connector rear end surface 3 from being damaged by the bent and abnormal posture of the conduction pin 50 or the erroneous inspection.

Even when the tip end 51 of the conduction pin 50 is slightly bent and tilted, in a case where the tip end 51 enters the conduction pin hole 35 and protrudes from the conduction pin hole 35, the connector rear end surface 3 is not damaged, and there is no problem in the conduction inspection.

Further, as described above, since the jig main body 10 is suspended and does not include a jig substrate as in the prior art, there is no restriction on the place where the conduction inspection is performed, for example, conduction inspection can be performed in part of a car manufacturing line or the like, and mobility is improved.

Further, the operator holds the connector 1 with one hand and holds the jig main body 10 with the other hand and inserts the connector rear portion 2 into the main body guide portion 12, then the conduction inspection can be performed, so that the operation is simple and quick. At this time, since the guide pins 20 are arranged asymmetrically, erroneous insertion of the connector 1 is prevented.

Furthermore, since the guide means and the lever mechanism as in the prior art are not provided, the structure of the jig is simple and lightweight, and the jig cost is low.

At the time other than the conduction inspection, since the tip ends 51 of the conduction pins 50 are positioned between the pin guard plate 30 and the main body bottom portion 19 and do not protrude from the surface of the pin guard plate 30, even when a foreign object (including the finger of an operator or the like) collides with the pin guard plate 30, damage to the conduction pins 50 is prevented.

Second Embodiment

Figure 5:
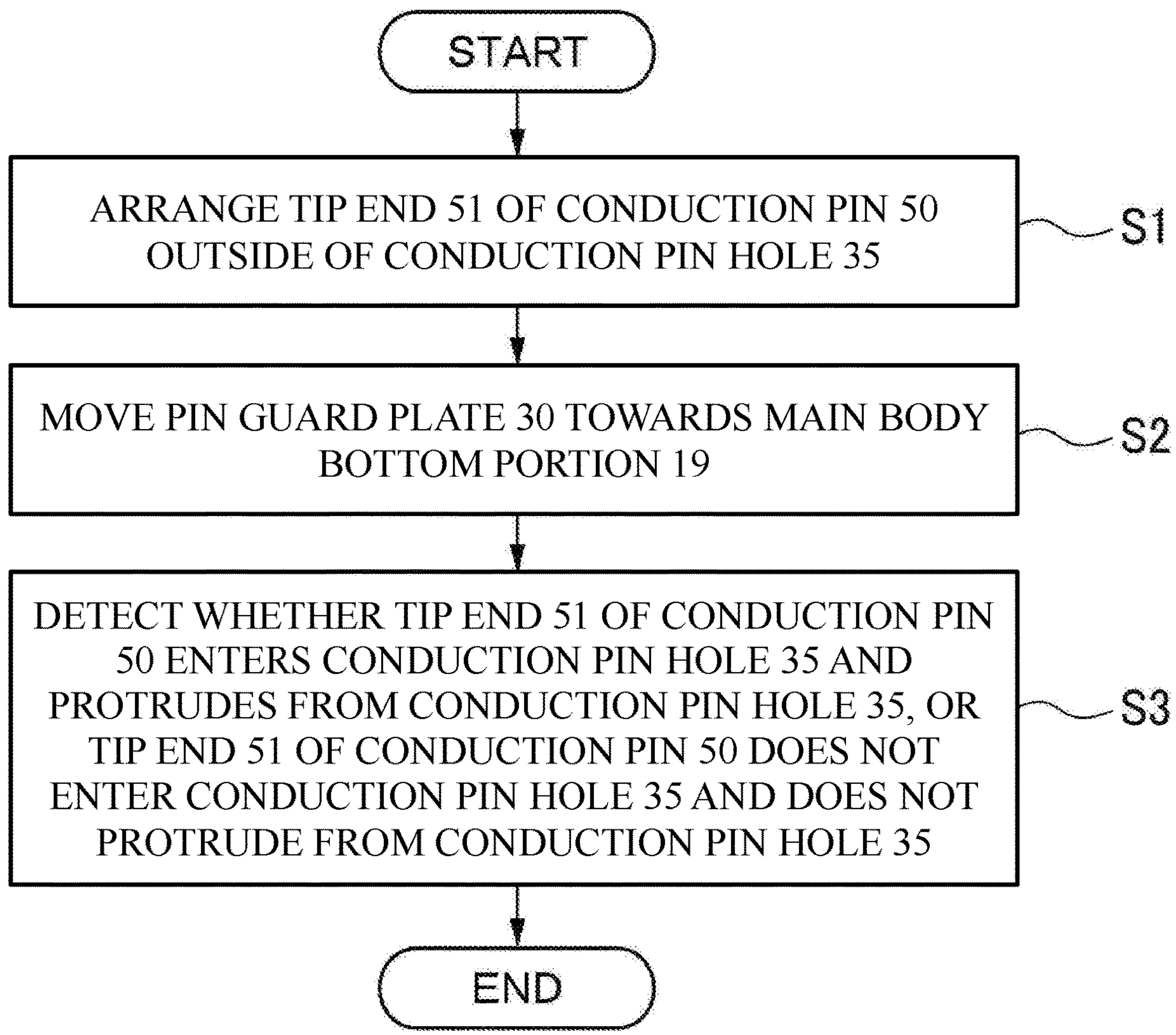
FIG. 5 is a flowchart illustrating an inspection method of a conduction pin according to a second embodiment of the present invention.

FIG. 5 is a flowchart illustrating an inspection method of a conduction pin according to a second embodiment of the present invention. Since the conduction pin 50 in the conduction inspection jig 100 described in the first embodiment is inspected, a description of the same contents as those in the first embodiment will be omitted.

In FIG. 5, the inspection method of the conduction pin includes: a first step (51) of arranging the tip end 51 of the conduction pin 50 outside the conduction pin hole 35, a second step (S2) of moving the pin guard plate 30 towards the main body bottom portion 19, and a third step (S3) of detecting whether the tip end 51 of the conduction pin 50 enters the conduction pin hole 35 and protrudes from the conduction pin hole 35 or the tip end 51 of the conduction pin 50 does not enter the conduction pin hole 35 and does not protrude from the conduction pin hole 35.

(Effects)

Therefore, similarly to the first embodiment, it is detected that the conduction pin 50 in a bent and abnormal posture is blocked by the rear surface 39 of the pin guard plate 30 and cannot enter the conduction pin hole 35, so that the conduction inspection cannot be performed. Therefore, since the soundness of the posture of the conduction pin 50 is detected, the connector rear end surface 3 is prevented from being damaged or erroneous inspection is performed by using the conduction pin 50 in a bent and abnormal posture.

The manner of detection in the third step is not limited, and may be any of an electrical means, an image processing means, a load detection means, a visual observation by an operator, and determination by a force control.

The present invention has been described above based on the first and second embodiments. It is to be understood by those skilled in the art that the first and second embodiments are exemplary, and that various modifications can be made to the respective components and combinations thereof, which are also within the scope of the present invention.

INDUSTRIAL APPLICABILITY

As described above, the present invention can be widely used as a conduction inspection jig for inspecting conduction of terminals accommodated in various types of connectors.

What is claimed is:

1. A conduction inspection jig comprising:

a tubular jig main body including a main body bottom portion;

a main body guide portion formed on an opening portion of the jig main body and guiding a connector to be inspected;

a pin guard plate arranged so as to be movable back and forth between the main body bottom portion and the main body guide portion; and a conduction pin fixed to the main body bottom portion and capable of being in contact with a terminal to be inspected installed in the connector, wherein a conduction pin hole is formed in the pin guard plate, and disposed in a same arrangement as the terminal to be inspected, a tip end of the conduction pin is positioned outside the conduction pin hole before conduction inspection, and when the pin guard plate moves towards a side of the main body bottom portion with a start of the conduction inspection, the conduction pin enters into the conduction pin hole and thereby a tip end of the conduction pin protrudes from the conduction pin hole.

2. The conduction inspection jig according to claim 1, further comprising a guide pin guiding the pin guard plate and whose a rear end thereof is fixed to the main body bottom portion.

3. The conduction inspection jig according to claim 1, further comprising a biasing portion biasing the pin guard plate toward the main body guide portion.

4. An inspection method of a conduction pin for inspecting a conduction pin of a conduction inspection jig, the conduction inspection jig including a tubular jig main body having a main body bottom portion, a main body guide portion formed on an opening portion of the jig main body and guiding a connector to be inspected, a pin guard plate arranged so as to be movable back and forth between the main body bottom portion and the main body guide portion, a conduction pin fixed to the main body bottom portion and capable of being in contact with a terminal to be inspected installed in the connector, and a conduction pin hole disposed in a same arrangement as the terminal to be inspected, the inspection method comprising:

a first step of arranging a tip end of the conduction pin outside the conduction pin hole;

a second step of moving the pin guard plate to a side of the main body bottom portion; and a third step of detecting whether or not the conduction pin enters into the conduction pin hole and the tip end of the conduction pin protrudes from the conduction pin hole or the conduction pin does not enter into the conduction pin hole and the tip end of the conduction pin does not protrude from the conduction pin hole.

* * * * *